United States Patent
Ujita et al.

(10) Patent No.: US 11,515,412 B2
(45) Date of Patent: Nov. 29, 2022

(54) NITRIDE SEMICONDUCTOR DEVICE

(71) Applicant: Panasonic Corporation, Kadoma (JP)

(72) Inventors: Shinji Ujita, Osaka (JP); Daisuke Shibata, Kyoto (JP); Satoshi Tamura, Osaka (JP)

(73) Assignee: PANASONIC HOLDINGS CORPORATION, Kadoma (JP)

( * ) Notice: Subject to any disclaimer, the term of this patent is extended or adjusted under 35 U.S.C. 154(b) by 47 days.

(21) Appl. No.: 17/026,849

(22) Filed: Sep. 21, 2020

(65) Prior Publication Data

US 2021/0005742 A1 Jan. 7, 2021

Related U.S. Application Data

(63) Continuation of application No. PCT/JP2019/005994, filed on Feb. 19, 2019.

(30) Foreign Application Priority Data

Mar. 27, 2018 (JP) .............................. JP2018-060958

(51) Int. Cl.
*H01L 29/778* (2006.01)
*H01L 29/20* (2006.01)
(Continued)

(52) U.S. Cl.
CPC ...... *H01L 29/7788* (2013.01); *H01L 29/2003* (2013.01); *H01L 29/205* (2013.01); *H01L 29/41766* (2013.01); *H01L 29/7786* (2013.01)

(58) Field of Classification Search
CPC ......... H01L 29/66431; H01L 29/66462; H01L 29/778–7789
See application file for complete search history.

(56) References Cited

U.S. PATENT DOCUMENTS 5,977,609 A * 11/1999 Soderbarg ............. H01L 21/763
257/501
2012/0153300 A1* 6/2012 Lidow ................. H01L 29/7787
257/77

(Continued)

FOREIGN PATENT DOCUMENTS

JP 2013-172108 A 9/2013
JP 2014-003200 A 1/2014
(Continued)

OTHER PUBLICATIONS

International Search Report dated Apr. 23, 2019, issued in counterpart International Application No. PCT/JP2019/005994. (1 page).

*Primary Examiner* — Eric A. Ward
(74) *Attorney, Agent, or Firm* — WHDA, LLP

(57) ABSTRACT

A nitride semiconductor device includes: a substrate; a first nitride semiconductor layer of a first conductivity type; a second nitride semiconductor layer of a second conductivity type; an electron transport layer and an electron supply layer provided, in that order from a side on which the substrate is located, above the second nitride semiconductor layer and on an inner surface of a first opening; a gate electrode provided above the electron supply layer and covering the first opening; a source electrode provided in a second opening and connected to the second nitride semiconductor layer; a drain electrode; a third opening at an outermost edge part in a plan view of the substrate; and a potential fixing electrode provided in the third opening, the potential fixing electrode being connected to the second nitride semiconductor layer and in contact with neither the electron transport layer nor the electron supply layer.

8 Claims, 12 Drawing Sheets

(51) Int. Cl.
*H01L 29/205* (2006.01)
*H01L 29/417* (2006.01)

(56) References Cited

U.S. PATENT DOCUMENTS

| | | | |
|---|---|---|---|
| 2015/0034904 A1 | 2/2015 | Fujimoto | |
| 2016/0079410 A1* | 3/2016 | Yasumoto | ............... H01L 29/04 257/329 |
| 2017/0125574 A1 | 5/2017 | Chowdhury et al. | |
| 2017/0250274 A1* | 8/2017 | Nakayama | ........ H01L 21/02694 |
| 2018/0026099 A1* | 1/2018 | Miyamoto | .......... H01L 23/5286 257/77 |
| 2018/0350965 A1 | 12/2018 | Shibata et al. | |

FOREIGN PATENT DOCUMENTS

| | | |
|---|---|---|
| JP | 2015-32744 A | 2/2015 |
| JP | 2016-58648 A | 4/2016 |
| WO | 2017/138505 A1 | 8/2017 |

\* cited by examiner

NITRIDE SEMICONDUCTOR DEVICE

CROSS REFERENCE TO RELATED APPLICATIONS

This application is a U.S. continuation application of PCT International Patent Application Number PCT/JP2019/005994 filed on Feb. 19, 2019, claiming the benefit of priority of Japanese Patent Application Number 2018-060958 filed on Mar. 27, 2018, the entire contents of which are hereby incorporated by reference.

BACKGROUND

1. Technical Field

The present disclosure relates to a nitride semiconductor device.

2. Description of the Related Art

Nitride semiconductors, such as gallium nitride (GaN), are wide-gap semiconductors which have large band-gaps, and feature greater breakdown fields and higher electron saturated drift velocities than gallium arsenide (GaAs) semiconductors, silicon (Si) semiconductors, and the like. As such, power transistors using nitride semiconductors, which are useful in achieving higher outputs and breakdown voltages, are being researched and developed.

For example, International Publication No. WO2017/138505 discloses a semiconductor device formed on a GaN-type layered body. The semiconductor device described in International Publication No. WO2017/138505 is a vertical field effect transistor (FET) including a regrowth layer positioned so as to cover an opening formed in the GaN-type layered body and a gate electrode positioned on the regrowth layer so as to follow the regrowth layer. A channel is formed by two-dimensional electron gas (2DEG) produced by the regrowth layer, and thus a FET with high mobility and a low on-resistance is achieved.

SUMMARY

In a vertical field effect transistor, leakage current flowing across the drain and the gate is an issue, particularly at peripheral parts of the device.

Accordingly, the present disclosure provides a nitride semiconductor device that suppresses leakage current.

To solve the aforementioned problem, a nitride semiconductor device according to an aspect of the present disclosure includes: a substrate having a first main surface and a second main surface which face in opposite directions; a first nitride semiconductor layer of a first conductivity type provided above the first main surface; a second nitride semiconductor layer of a second conductivity type provided above the first nitride semiconductor layer, the second conductivity type being different from the first conductivity type; a first opening which penetrates through the second nitride semiconductor layer to the first nitride semiconductor layer; an electron transport layer and an electron supply layer provided, in that order from a side on which the substrate is located, above the second nitride semiconductor layer and on an inner surface of the first opening; a gate electrode provided above the electron supply layer and covering the first opening; a second opening at a position distanced from the gate electrode, the second opening penetrating through the electron supply layer and the electron transport layer to the second nitride semiconductor layer; a source electrode provided in the second opening and connected to the second nitride semiconductor layer; a drain electrode provided on a second main surface-side of the substrate; a third opening at an outermost edge part in a plan view of the substrate, the third opening penetrating through the electron supply layer and the electron transport layer to the second nitride semiconductor layer; and a potential fixing electrode provided in the third opening, the potential fixing electrode being connected to the second nitride semiconductor layer and in contact with neither the electron transport layer nor the electron supply layer.

According to an aspect of the present disclosure, a nitride semiconductor device that suppresses leakage current can be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
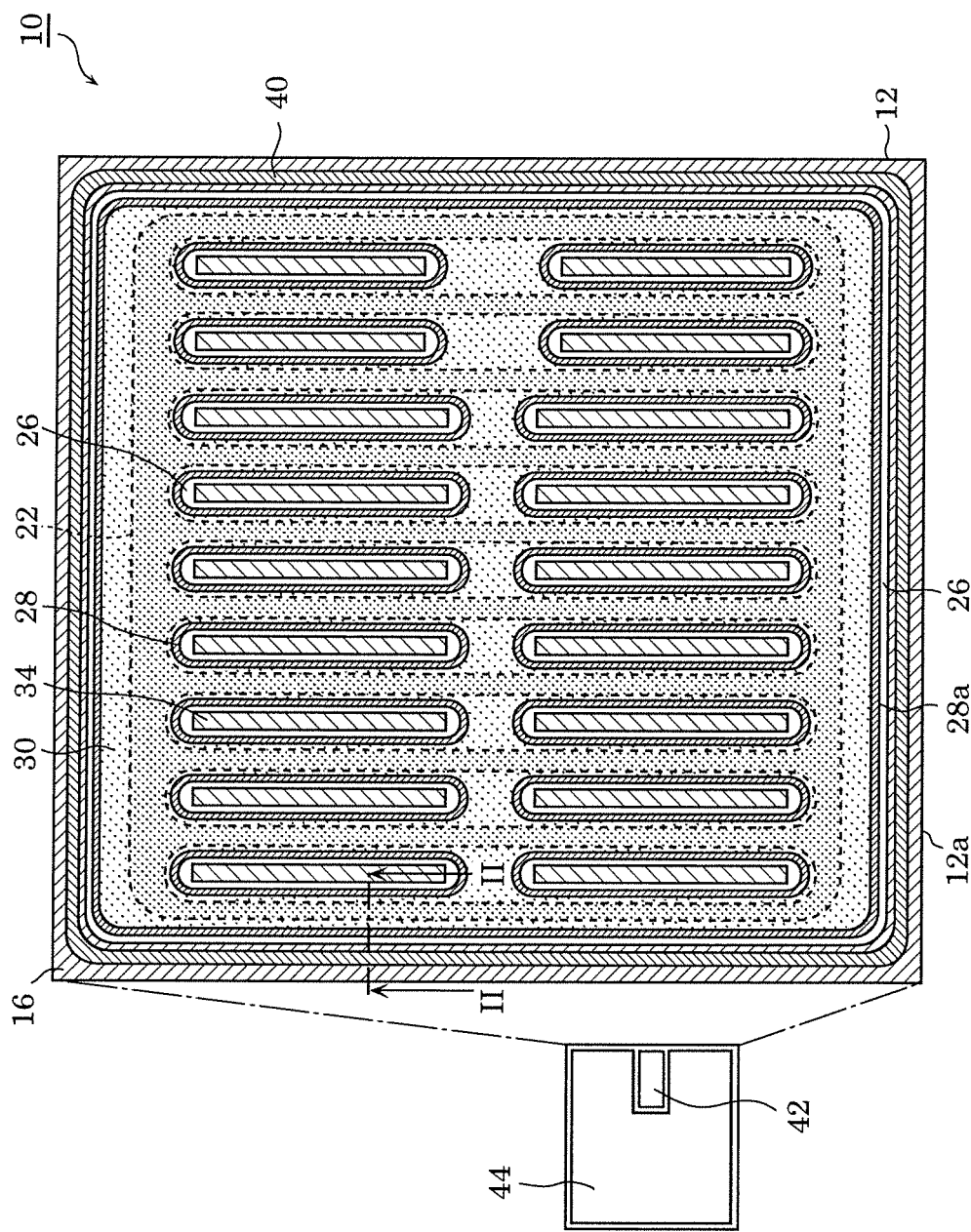
FIG. 1 is a plan view illustrating the planar layout of a nitride semiconductor device according to Embodiment 1.

Underlying Knowledge Forming Basis of Present Disclosure

In a vertical field effect transistor, the drain electrode is separated from the gate electrode and the source electrode by a substrate, and it is therefore easy to reduce leakage current across the drain and the gate and across the drain and the source. However, it is easy for an electrical field to concentrate at an outermost edge part of the substrate, which makes it easy for leakage current to arise. Specifically, two-dimensional electron gas is present within a regrowth layer even at the outermost edge part of the substrate, and thus leakage current easily arises across the drain and the gate via the end surface at the outermost edge part of the field effect transistor and the two-dimensional electron gas.

Additionally, in a vertical field effect transistor, a base layer is provided for forming a pn junction with a drift layer. When, for example, the drift layer is formed using an n-type nitride semiconductor, the base layer is formed using a p-type nitride semiconductor. The source electrode is provided so as to make contact with the base layer, and the breakdown voltage of the field effect transistor is increased by forming a barrier layer at the interface between the base layer and the drift layer through a voltage applied across the source and the drain.

At this time, the source electrode is not formed in the outermost edge part of the substrate, and thus the potential of the base layer is in a floating state. When the potential of the base layer is in a floating state, the raising of the channel potential by the base layer will be insufficient, and leakage current flowing from the drain electrode to the gate electrode via the drift layer and the two-dimensional electron gas will arise.

Thus as described above, in a vertical field effect transistor, leakage current arising across the drain and the gate at an outermost edge part, seen in a plan view, is a problem.

Accordingly, to solve the aforementioned problem, a nitride semiconductor device according to an aspect of the present disclosure includes: a substrate having a first main surface and a second main surface which face in opposite directions; a first nitride semiconductor layer of a first conductivity type provided above the first main surface; a second nitride semiconductor layer of a second conductivity type provided above the first nitride semiconductor layer, the second conductivity type being different from the first conductivity type; a first opening which penetrates through the second nitride semiconductor layer to the first nitride semiconductor layer; an electron transport layer and an electron supply layer provided, in that order from a side on which the substrate is located, above the second nitride semiconductor layer and on an inner surface of the first opening; a gate electrode provided above the electron supply layer and covering the first opening; a second opening at a position distanced from the gate electrode, the second opening penetrating through the electron supply layer and the electron transport layer to the second nitride semiconductor layer; a source electrode provided in the second opening and connected to the second nitride semiconductor layer; a drain electrode provided on a second main surface-side of the substrate; a third opening at an outermost edge part in a plan view of the substrate, the third opening penetrating through the electron supply layer and the electron transport layer to the second nitride semiconductor layer; and a potential fixing electrode provided in the third opening, the potential fixing electrode being connected to the second nitride semiconductor layer and in contact with neither the electron transport layer nor the electron supply layer.

The third opening is provided in the outermost edge part, and leakage current flowing via an end surface of the outermost edge part and two-dimensional electron gas can therefore be suppressed. Furthermore, of the second nitride semiconductor layer connected to the source electrode, the potential of the part located at the outermost edge part in a plan view of the substrate is fixed, which makes it possible to suppress leakage current flowing via the substrate, the drift layer, and the two-dimensional electron gas at the outermost edge part. Thus according to this aspect, a nitride semiconductor device that suppresses leakage current can be realized.

Additionally, for example, in a plan view of the substrate, the third opening may have an annular shape extending along an entirety of the outermost edge part.

The third opening has an annular shape extending along the entire perimeter, and leakage current flowing via the end surface and the two-dimensional electron gas can therefore be reduced even more at the outermost edge part of the nitride semiconductor device.

Additionally, for example, in a plan view of the substrate, the potential fixing electrode may have an annular shape extending along an entirety of the outermost edge part.

Accordingly, the potential of the second nitride semiconductor layer is fixed along the entire perimeter, and leakage current flowing via the substrate, the drift layer, and the two-dimensional electron gas can therefore be reduced even more at the outermost edge part of the nitride semiconductor device.

Additionally, for example, a planar shape of the substrate may be a quadrangle, and the potential fixing electrode may be provided as a plurality of island shapes, each located on a corresponding one of sides of the substrate in a plan view of the substrate.

This makes it possible to suppress the occurrence of electrical field concentration at what are the four corners of the nitride semiconductor device in a plan view. By suppressing the occurrence of electrical field concentration, the breakdown voltage of the nitride semiconductor device can be increased, and leakage current can be reduced.

Additionally, for example, the potential fixing electrode may be electrically connected to the source electrode via a conductive wiring layer.

Through this, it is not necessary to provide a separate electrode pad for applying a predetermined potential to the potential fixing electrode, and the device can therefore be realized as a three-terminal device, in the same manner as a typical FET.

Additionally, a nitride semiconductor device according to an aspect of the present disclosure may further include a fourth opening provided in the outermost edge part outward of the potential fixing electrode and penetrating through the second nitride semiconductor layer to the first nitride semiconductor layer.

By providing the fourth opening, leakage current flowing in a path from an end surface of the outermost edge part to the two-dimensional electron gas via the second nitride semiconductor layer can be suppressed.

Additionally, for example, a nitride semiconductor device according to an aspect of the present disclosure may further include a high-resistance region provided on a bottom surface of the fourth opening and having a resistance higher than a resistance of the first nitride semiconductor layer.

By providing the high-resistance region, leakage current flowing in a path from an end surface of the outermost edge part to the two-dimensional electron gas via a surface part of the first nitride semiconductor layer can be suppressed.

Embodiments of the present disclosure will be described hereinafter with reference to the drawings.

Note that the following embodiments describe comprehensive or specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims will be described as optional constituent elements.

Additionally, the drawings are schematic diagrams, and are not necessarily exact illustrations. As such, the scales and so on, for example, are not necessarily consistent from drawing to drawing. Furthermore, configurations that are substantially the same are given the same reference signs in the drawings, and redundant descriptions will be omitted or simplified.

Additionally, in the present specification, terms indicating relationships between elements, such as "parallel" or "perpendicular", terms indicating the shapes of elements, such as "rectangular" or "circular", and numerical value ranges do not express the items in question in the strictest sense, but rather include substantially equivalent ranges, e.g., differences of several percent, as well.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered structures. In the present specification, relative to a substrate, a side on which a gate electrode, a source electrode, and so on are provided will be referred to as "upward", and a side on which a drain electrode is provided will be referred to as "downward". Moreover, terms such as "above" and "below" are used not only in cases where two constituent elements are disposed with an interval therebetween and another constituent element is present between the stated two constituent elements, but also in cases where two constituent elements are disposed in close contact with each other.

In the present specification, "AlGaN" refers to an $Al_xGa_{1-x}N$ ternary mixed crystal (where $0 \leq x \leq 1$). Hereinafter, for multidimensional mixed crystals, the arrangements of the respective constituent elements are abbreviated, e.g., AlInN and GaInN. For example, $Al_xGa_{1-x-y}In_yN$ (where $0 \leq x \leq 1$, $0 \leq y \leq 1$, and $x+y \leq 1$), which is a nitride semiconductor, is abbreviated as "AlGaInN".

Embodiment 1

Configuration

First, the configuration of a nitride semiconductor device according to Embodiment 1 will be described with reference to FIGS. 1 and 2.

FIG. 1 is a plan view illustrating the planar layout of nitride semiconductor device 10 according to the present embodiment. FIG. 2 is a cross-sectional view of nitride semiconductor device 10 according to the present embodiment.

Figure 2:
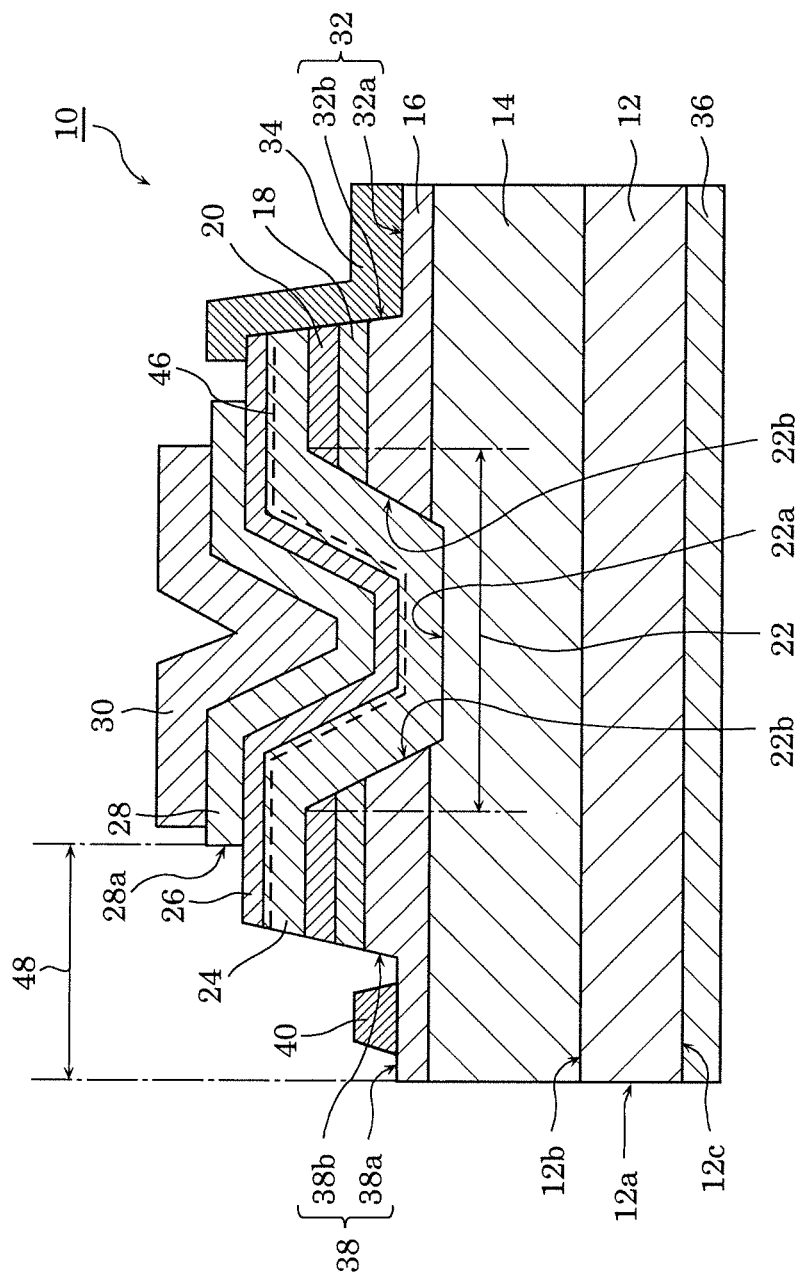
FIG. 2 is a cross-sectional view of the nitride semiconductor device according to Embodiment 1.

Here, FIG. 2 illustrates a cross-section of nitride semiconductor device 10 according to the present embodiment from line II-II in FIG. 1. Specifically, FIG. 2 illustrates a range of the plan view including outermost edge part 48 of nitride semiconductor device 10.

As illustrated in FIG. 2, outermost edge part 48 is, for example, a region located, in a plan view, between outer edge 12a on the outermost perimeter of substrate 12 and outer edge 28a of threshold control layer 28 closest to outer edge 12a. As can be seen by comparing FIGS. 1 and 2, outermost edge part 48 is an annular region which follows outer edge 12a of substrate 12.

Note that if threshold control layer 28 is not provided, outermost edge part 48 may be a region located, in a plan view, between outer edge 12a on the outermost perimeter of substrate 12 and an outer edge of gate electrode 30 closest to outer edge 12a.

As illustrated in FIG. 1, nitride semiconductor device 10 includes a plurality of source electrodes 34 arranged in a plane. Planar shapes of the plurality of source electrodes 34 are rectangles which are longer in a predetermined direction. In a plan view, the plurality of source electrodes 34 are arranged in both a lengthwise direction and a widthwise direction. In the example illustrated in FIG. 1, two source electrodes 34 are arranged in the lengthwise direction and nine source electrodes 34 are arranged in the widthwise direction. Note that the number and shape of source electrodes 34 is not limited thereto.

As illustrated in FIG. 1, the plurality of source electrodes 34 are surrounded by gate electrode 30. Gate electrode 30 is a single plate-shaped electrode in which openings are formed in positions corresponding to source electrodes 34. In a plan view, gate electrode 30 and source electrodes 34 are distanced from each other and do not overlap.

Note that gate electrode 30 may be a comb-tooth shape electrode. Specifically, a direction in which comb teeth of gate electrode 30 extend is parallel to the lengthwise direction of source electrodes 34. Additionally, nitride semiconductor device 10 may include a plurality of gate electrodes 30 provided between adjacent ones of source electrodes 34.

Note also that the shapes of gate electrode 30 and source electrodes 34 are not limited to the examples illustrated in FIG. 1. For example, the planar shape of source electrodes 34 may be a hexagon. The plurality of source electrodes 34 having hexagonal planar shapes may be arranged so that, in a plan view, the centers of the plurality of source electrodes 34 are located at the vertices of regular hexagons arranged so as to fill in the area of the device.

In the present embodiment, nitride semiconductor device 10 is a device having a layered structure of semiconductor layers that take a nitride semiconductor such as GaN or AlGaN as a primary component. Specifically, nitride semiconductor device 10 has a heterostructure of an AlGaN film and a GaN film.

In the heterostructure of an AlGaN film and a GaN film, highly-concentrated two-dimensional electron gas (2DEG) 46 is produced at the hetero interface due to spontaneous polarization or piezoelectric polarization on a (0001) plane. The device therefore has a characteristic where a sheet carrier concentration of $1 \times 10^{13}$ $cm^{-2}$ or more is achieved at the interface, even in an undoped state.

Nitride semiconductor device 10 according to the present embodiment is a field effect transistor (FET) which uses two-dimensional electron gas 46 produced at the AlGaN/GaN hetero interface as a channel. Specifically, nitride semiconductor device 10 is what is known as a vertical FET.

As illustrated in FIG. 2, nitride semiconductor device 10 includes substrate 12, drift layer 14, first base layer 16, second base layer 18, third base layer 20, gate opening 22, electron transport layer 24, electron supply layer 26, threshold control layer 28, gate electrode 30, source opening 32, source electrode 34, drain electrode 36, outer perimeter opening 38, and potential fixing electrode 40. Nitride semiconductor device 10 further includes gate electrode pad 42 and source electrode pad 44, as illustrated in FIG. 1.

Substrate 12 is a substrate constituted by a nitride semiconductor, and as illustrated in FIG. 2, has first main surface 12b and second main surface 12c which face in opposite directions. First main surface 12b is a main surface on a side where drift layer 14 is formed. Specifically, first main surface 12b substantially coincides with the c plane. Second main surface 12c is a main surface on a side where drain electrode 36 is formed. As illustrated in FIG. 1, the planar shape of substrate 12 is a quadrangle, for example, but the shape is not limited thereto.

Substrate 12 is, for example, a substrate formed from n$^+$-type GaN with a thickness of 300 µm and a carrier concentration of $1\times10^{18}$ cm$^{-3}$. Note that "n-type" and "p-type" indicate conductivity types of semiconductors. In the present embodiment, "n-type" is an example of a first conductivity type of a nitride semiconductor. "p-type" is an example of a second conductivity type having a different polarity from the first conductivity type. "n$^+$-type" indicates a state where an n-type dopant has been excessively added to a semiconductor, i.e., a so-called "heavily-doped" state. "n$^-$-type" indicates a state where an n-type dopant has been insufficiently added to a semiconductor, i.e., a so-called "lightly-doped" state. The same applies to "p$^+$-type" and "p$^-$-type".

Drift layer 14 is an example of a first nitride semiconductor layer having the first conductivity type, and is provided above first main surface 12b of substrate 12. Drift layer 14 is, for example, a film formed from n$^-$-type GaN with a thickness of 8 µm and a carrier concentration of $1\times10^{16}$ cm$^{-3}$. Drift layer 14 is provided so as to be in contact with first main surface 12b of substrate 12, for example. Drift layer 14 is formed on first main surface 12b of substrate 12 through crystal growth achieved by metalorganic vapor-phase epitaxy (MOVPE), for example.

First base layer 16 is an example of a second nitride semiconductor layer having the second conductivity type, which is different from the first conductivity type, and is provided above drift layer 14. First base layer 16 is, for example, a film formed from p-type GaN with a thickness of 400 nm and a carrier concentration of $1\times10^{17}$ cm$^{-3}$. First base layer 16 is provided so as to be in contact with an upper surface of drift layer 14. First base layer 16 is formed on drift layer 14 through crystal growth achieved by MOVPE or the like, for example.

First base layer 16 suppresses leakage current between source electrode 34 and drain electrode 36. For example, when a reverse voltage is applied to a pn junction formed by first base layer 16 and drift layer 14, and more specifically, when drain electrode 36 is at a higher potential than source electrode 34, a barrier layer extends along drift layer 14. This makes it possible to increase the breakdown voltage of nitride semiconductor device 10.

Second base layer 18 is disposed on first base layer 16. Second base layer 18 is formed from an insulative or semi-insulative nitride semiconductor. Second base layer 18 is, for example, a film formed from undoped GaN having a thickness of 200 nm. Second base layer 18 is provided so as to be in contact with first base layer 16. Second base layer 18 is formed on first base layer 16 through crystal growth achieved by MOVPE or the like, for example.

Note that "undoped" means that the material is not doped with a dopant such as silicon (Si) or magnesium (Mg), which changes the polarity of GaN to n-type or p-type. In the present embodiment, second base layer 18 is doped with carbon. Specifically, second base layer 18 has a higher carbon concentration than first base layer 16.

Additionally, second base layer 18 may contain silicon (Si) or oxygen (O) which intermix during film formation. In this case, the carbon concentration of second base layer 18 is higher than the silicon concentration or the oxygen concentration. For example, the carbon concentration of second base layer 18 is $3\times10^{17}$ cm$^{-3}$ or more, but may be $1\times10^{18}$ cm$^{-3}$ or more. The silicon concentration or oxygen concentration of second base layer 18 is $5\times10^{16}$ cm$^{-3}$ or less, but may be $2\times10^{16}$ cm$^{-3}$ or less.

Here, if nitride semiconductor device 10 does not include second base layer 18, a layered structure of the n-type electron supply layer 26, electron transport layer 24, third base layer 20, the p-type first base layer 16, and the n-type drift layer 14 is present between source electrode 34 and drain electrode 36. This layered structure corresponds to a parasitic bipolar transistor having a parasitic npn structure.

If, when nitride semiconductor device 10 is off, current flows in first base layer 16, the parasitic bipolar transistor will turn on, and the breakdown voltage of nitride semiconductor device 10 may drop as a result. In this case, nitride semiconductor device 10 is more likely to malfunction.

Second base layer 18 prevents this parasitic npn structure from being formed. Accordingly, malfunctions in nitride semiconductor device 10 caused by the parasitic npn structure being formed can be reduced.

Third base layer 20 is disposed on second base layer 18. Third base layer 20 is, for example, a film formed from $Al_{0.2}Ga_{0.8}N$ having a thickness of 20 nm. Third base layer 20 is provided so as to be in contact with second base layer 18. Third base layer 20 is formed on second base layer 18 through crystal growth achieved by MOVPE or the like, for example. Note that the layers from drift layer 14 to third base layer 20 may be formed continuously. Third base layer 20 suppresses the dispersion of p-type impurities such as Mg from first base layer 16. If Mg has dispersed as far as a channel within electron transport layer 24, there is a risk that the carrier concentration of two-dimensional electron gas 46 will drop and the on-resistance will rise. Note that the degree to which Mg disperses differs depending on conditions of epitaxial growth and the like as well. Accordingly, if Mg dispersion is already suppressed, nitride semiconductor device 10 need not include third base layer 20.

Additionally, third base layer 20 may have a function for supplying electrons to a channel formed at an interface between electron transport layer 24 and electron supply layer 26. Third base layer 20 has a greater band-gap than electron supply layer 26, for example.

Gate opening 22 is an example of a first opening which penetrates through first base layer 16 to drift layer 14. Specifically, gate opening 22 penetrates from an upper surface of third base layer 20, through third base layer 20, second base layer 18, and first base layer 16 in that order, and reaches as far as drift layer 14. Bottom part 22a of gate opening 22 corresponds to the upper surface of drift layer 14. In the present embodiment, bottom part 22a of gate opening 22 is positioned lower than an interface between drift layer 14 and first base layer 16, as illustrated in FIG. 2.

In the present embodiment, gate opening 22 is formed so that the area of the opening increases with distance from substrate 12. Specifically, side wall part 22b of gate opening 22 is inclined at an angle. For example, the cross-sectional shape of gate opening 22 is an inverted trapezoid, and more specifically, an inverted isosceles trapezoid. Note that in FIG. 1, the contour of an upper end of gate opening 22 is indicated by a broken line. A contour of bottom part 22a of gate opening 22 is slightly smaller than the contour indicated in FIG. 1.

Gate opening 22 is formed by etching third base layer 20, second base layer 18, and first base layer 16 so as to partially expose drift layer 14 after forming drift layer 14 to third base layer 20 in that order on first main surface 12b of substrate 12. At this time, bottom part 22a of gate opening 22 is formed below the interface between drift layer 14 and first base layer 16 by partially removing a surface part of drift layer 14. Gate opening 22 is formed in a predetermined shape through, for example, patterning through photolithography, dry etching, and the like.

Electron transport layer 24 is a first regrowth layer provided above first base layer 16 and on an inner surface of gate opening 22. Specifically, electron transport layer 24 is formed on the upper surface of third base layer 20, and side wall part 22b and bottom part 22a of gate opening 22, at a substantially uniform thickness. Electron transport layer 24 is, for example, a film formed from undoped GaN having a thickness of 100 nm.

Electron transport layer 24 makes contact with drift layer 14 at bottom part 22a of gate opening 22. Electron transport layer 24 makes contact with an end surface of each of first base layer 16, second base layer 18, and third base layer 20 at side wall part 22b of gate opening 22. Furthermore, electron transport layer 24 makes contact with the upper surface of third base layer 20. Electron transport layer 24 is formed through crystal regrowth after gate opening 22 has been formed.

Electron transport layer 24 has a channel. Specifically, two-dimensional electron gas 46 is produced near the interface between electron transport layer 24 and electron supply layer 26. Two-dimensional electron gas 46 functions as the channel of electron transport layer 24. In FIG. 2, two-dimensional electron gas 46 is schematically indicated by a broken line. Although undoped here, electron transport layer 24 may be given n-type conductivity by being doped with Si or the like.

An approximately 1 nm-thick AlN film may be provided, as a second regrowth layer, between electron transport layer 24 and electron supply layer 26. The AlN film suppresses alloy scattering, which makes it possible to improve channel mobility.

Electron supply layer 26 is a third regrowth layer provided above first base layer 16 and on an inner surface of gate opening 22. Note that electron transport layer 24 and electron supply layer 26 are provided in that order from the substrate 12 side. Electron supply layer 26 is formed on an upper surface of electron transport layer 24 at a substantially uniform thickness. Electron supply layer 26 is, for example, a film formed from undoped $Al_{0.2}Ga_{0.8}N$ having a thickness of 50 nm. Electron supply layer 26 is formed through crystal regrowth after the process of forming electron transport layer 24.

Electron supply layer 26 forms an AlGaN/GaN hetero interface with electron transport layer 24. Two-dimensional electron gas 46 is produced within electron transport layer 24 as a result.

Electron supply layer 26 supplies electrons to the channel formed in electron transport layer 24 (i.e., to two-dimensional electron gas 46). Note that as described above, in the present embodiment, third base layer 20 also has a function of supplying electrons. Both electron supply layer 26 and third base layer 20 are formed from AlGaN, but the Al composition ratio is not particularly limited at this time. For example, the Al composition ratio of electron supply layer 26 may be 20%, and the Al composition ratio of third base layer 20 may be 25%.

Threshold control layer 28 is an example of a third nitride semiconductor layer of the second conductivity type, provided between gate electrode 30 and electron supply layer 26. Threshold control layer 28 is provided on electron supply layer 26, and makes contact with electron supply layer 26 and gate electrode 30.

In the present embodiment, when substrate 12 is seen in plan view, end parts of threshold control layer 28 are located at positions closer to source electrode 34 than end parts of gate electrode 30. Threshold control layer 28 and source electrode 34 are distanced from, and do not make contact with, each other. Thus as illustrated in FIG. 1, in a plan view, only an annular part of threshold control layer 28 surrounding source electrodes 34 is exposed and appears from the end parts of gate electrode 30.

Threshold control layer 28 is, for example, a nitride semiconductor layer formed from p-type $Al_{0.2}Ga_{0.8}N$ with a thickness of 100 nm and a carrier concentration of $1\times10^{17}$ $cm^{-3}$. Threshold control layer 28 is formed through MOVPE and patterning, after the process of forming electron supply layer 26.

Providing threshold control layer 28 increases the potential at the end of the conducting band of the channel part. This makes it possible to increase the threshold voltage of nitride semiconductor device 10. Accordingly, nitride semiconductor device 10 can be implemented as a normally-off FET.

Gate electrode 30 is provided above electron transport layer 24, so as to cover gate opening 22. In the present embodiment, gate electrode 30 is formed on the upper surface of threshold control layer 28 and in contact with the upper surface of threshold control layer 28, and is formed at a substantially uniform thickness.

Gate electrode 30 is formed using a conductive material such as a metal. Gate electrode 30 is formed using palladium (Pd), for example. Note that a material which is Schottky-connected to an n-type semiconductor can be used as the material of gate electrode 30, and thus a nickel (Ni)-based material, tungsten silicide (WSi), gold (Au), or the like can be used, for example. Gate electrode 30 is formed by patterning a conductive film formed through sputtering or vapor deposition, for example, after gate opening 22 has been formed.

In the present embodiment, in a plan view, end parts of gate electrode 30 are located at positions closer to source electrode 34 than end parts of gate opening 22, as illustrated in FIG. 1. Specifically, in a plan view, gate opening 22 is provided on an inner side of gate electrode 30.

Source opening 32 is an example of a second opening which penetrates through electron supply layer 26 and electron transport layer 24 to first base layer 16 at a position distanced from gate electrode 30. Specifically, source opening 32 penetrates through electron supply layer 26, electron transport layer 24, third base layer 20, and second base layer 18 in that order, and reaches as far as first base layer 16. In the present embodiment, bottom part 32a of source opening 32 corresponds to an upper surface of first base layer 16, as illustrated in FIG. 2. Bottom part 32a is positioned lower than an interface between first base layer 16 and second base layer 18. In a plan view, source opening 32 is disposed in a location distanced from gate opening 22.

As illustrated in FIG. 2, source opening 32 is formed so that the area of the opening increases with distance from substrate 12. Specifically, side wall part 32b of source opening 32 is inclined at an angle. For example, the cross-sectional shape of source opening 32 is an inverted trapezoid, and more specifically, an inverted isosceles trapezoid. Note that the cross-sectional shape of source opening 32 may be substantially quadrangular.

Source opening 32 is formed by etching electron supply layer 26, electron transport layer 24, third base layer 20, and second base layer 18 so as to expose first base layer 16 in a region different from gate opening 22, after the process of forming gate electrode 30, for example. At this time, bottom part 32a of source opening 32 is formed below the interface between first base layer 16 and second base layer 18 by partially removing a surface part of first base layer 16. Source opening 32 is formed in a predetermined shape through, for example, patterning through photolithography, dry etching, and the like.

Source electrode 34 is provided in source opening 32. Specifically, source electrode 34 is provided on an inner surface of source opening 32.

Source electrode 34 is connected to first base layer 16. Specifically, source electrode 34 is connected to an end surface of each of electron supply layer 26, electron transport layer 24, third base layer 20, and second base layer 18. Source electrode 34 makes ohmic contact with electron transport layer 24 and electron supply layer 26. As illustrated in FIG. 2, source electrode 34 does not make contact with threshold control layer 28.

Source electrode 34 is formed using a conductive material such as a metal. For example, a material which makes ohmic contact with an n-type semiconductor layer, such as Ti/Al, can be used as the material of source electrode 34. Source electrode 34 is formed by patterning a conductive film formed through sputtering or vapor deposition, for example.

The potential of first base layer 16 can be fixed by connecting source electrode 34 to first base layer 16. This makes it possible to stabilize the operations of nitride semiconductor device 10.

Additionally, Al is Schottky-connected to first base layer 16, which is constituted by a p-type nitride semiconductor. Accordingly, a metal material having a high work function, and which has a low contact resistance with respect to the p-type nitride semiconductor, such as Pd or Ni, may be provided on a lower layer part of source electrode 34. This makes it possible to further stabilize the potential of first base layer 16.

Drain electrode 36 is provided on the second main surface 12c side of substrate 12. Specifically, drain electrode 36 is provided so as to be in contact with second main surface 12c. Drain electrode 36 is formed using a conductive material such as a metal. For example, like source electrode 34, a material which makes ohmic contact with an n-type semiconductor layer, such as Ti/Al, can be used as the material of drain electrode 36. Drain electrode 36 is formed by patterning a conductive film formed through sputtering or vapor deposition, for example.

Outer perimeter opening 38 is an example of a third opening which penetrates through electron supply layer 26 and electron transport layer 24 to first base layer 16 at outermost edge part 48 of substrate 12 when seen in plan view. Specifically, outer perimeter opening 38 penetrates through electron supply layer 26, electron transport layer 24, third base layer 20, and second base layer 18 in that order, and reaches as far as first base layer 16. In the present embodiment, bottom part 38a of outer perimeter opening 38 corresponds to an upper surface of first base layer 16. Bottom part 38a is positioned lower than an interface between first base layer 16 and second base layer 18.

Outer perimeter opening 38 is formed through the same process as source opening 32, for example. Accordingly, bottom part 38a is at the same height as bottom part 32a of source opening 32. Note, however, that outer perimeter opening 38 may be formed through a different process from source opening 32.

In the present embodiment, when substrate 12 is seen in a plan view, outer perimeter opening 38 is provided in an annular shape extending around the entirety of outermost edge part 48. In other words, outer perimeter opening 38 extends continuously around the quadrangular outer edge 12a.

Additionally, as illustrated in FIG. 2, outer perimeter opening 38 is formed by cutting off electron supply layer 26, electron transport layer 24, third base layer 20, and second base layer 18, as well as a surface part of first base layer 16, from the edges thereof. In other words, in a cross-sectional view, side wall part 38b of outer perimeter opening 38 is not provided on outer edge 12a side of substrate 12, and is provided only toward the center of substrate 12. Alternatively, side wall part 38b of outer perimeter opening 38 may be provided on the outer edge 12a side as well.

Potential fixing electrode 40 is provided in outer perimeter opening 38, and is an electrode that is connected to first base layer 16 and that makes contact with neither electron transport layer 24 nor electron supply layer 26. As illustrated in FIG. 2, potential fixing electrode 40 is provided on bottom part 38a of outer perimeter opening 38. For example, potential fixing electrode 40 is provided at a distance from side wall part 38b of outer perimeter opening 38. Note that potential fixing electrode 40 may make contact with second base layer 18.

In the present embodiment, as illustrated in FIG. 1, when substrate 12 is seen in a plan view, potential fixing electrode 40 is provided in an annular shape extending around the entirety of outermost edge part 48. In other words, potential fixing electrode 40 extends continuously around the quadrangular outer edge 12a. Note that potential fixing electrode 40 is also called a "guard ring electrode". In a plan view, the four corners of potential fixing electrode 40 curve smoothly. This makes it possible to suppress electrical field concentration at the four corners. Note, however, that the four corners of potential fixing electrode 40 may bend at right angles instead.

Potential fixing electrode 40 is formed using a conductive material such as a metal. Potential fixing electrode 40 is formed using palladium (Pd), for example. Note that the same material as gate electrode 30, e.g., a nickel (Ni)-based material, tungsten silicide (WSi), titanium (Ti), hafnium (Hf), gold (Au), or the like, can be used as the material of potential fixing electrode 40.

Potential fixing electrode 40 is formed by patterning a conductive film formed through sputtering or vapor deposition, for example. At this time, gate electrode 30 and potential fixing electrode 40 can be formed through the same process and from the same material by forming outer perimeter opening 38 before forming gate electrode 30.

Potential fixing electrode 40 may be formed from the same material as source electrode 34, for example. When potential fixing electrode 40 is formed using the same material as source electrode 34, outer perimeter opening 38 can be formed through the same process as source opening 32. Furthermore, potential fixing electrode 40 can be formed through the same process as source electrodes 34. This makes it possible to suppress an increase in the number of processes.

In the present embodiment, potential fixing electrode 40 is electrically connected to source electrode 34 via a conductive wiring layer. In other words, potential fixing electrode 40 is fixed to the same potential as source electrode 34. Specifically, source electrode pad 44 is connected to potential fixing electrode 40.

Figure 3:
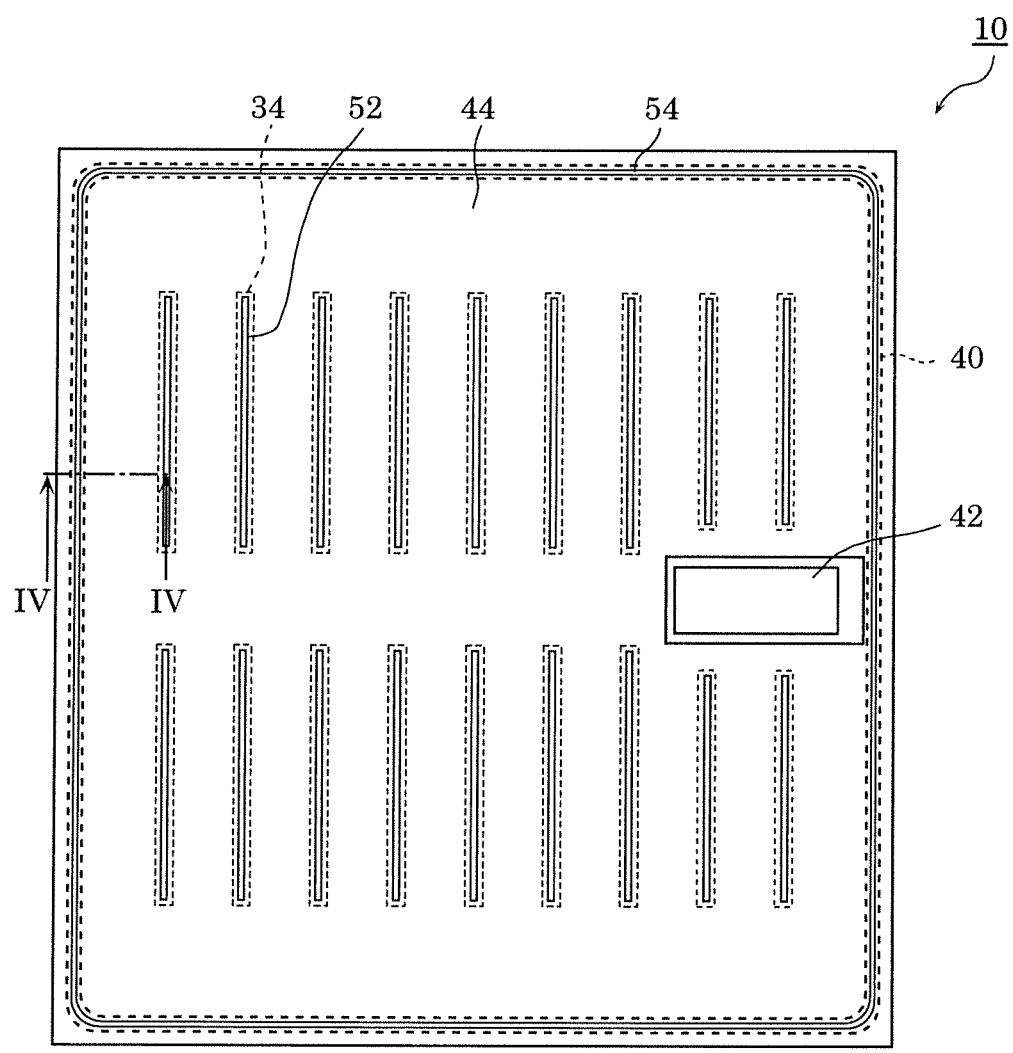
FIG. 3 is a plan view illustrating the planar shape of an electrode pad of a nitride semiconductor device according to Embodiment 1.

FIG. 3 is a plan view illustrating the planar shape of an electrode pad of nitride semiconductor device 10 according to the present embodiment. In FIG. 3, the shapes of contours of source electrodes 34 and potential fixing electrode 40, seen in plan view, are represented by broken lines. Other elements, such as gate electrode 30, are not illustrated. The same applies in FIGS. 6 and 7, which will be described later.

Figure 4:
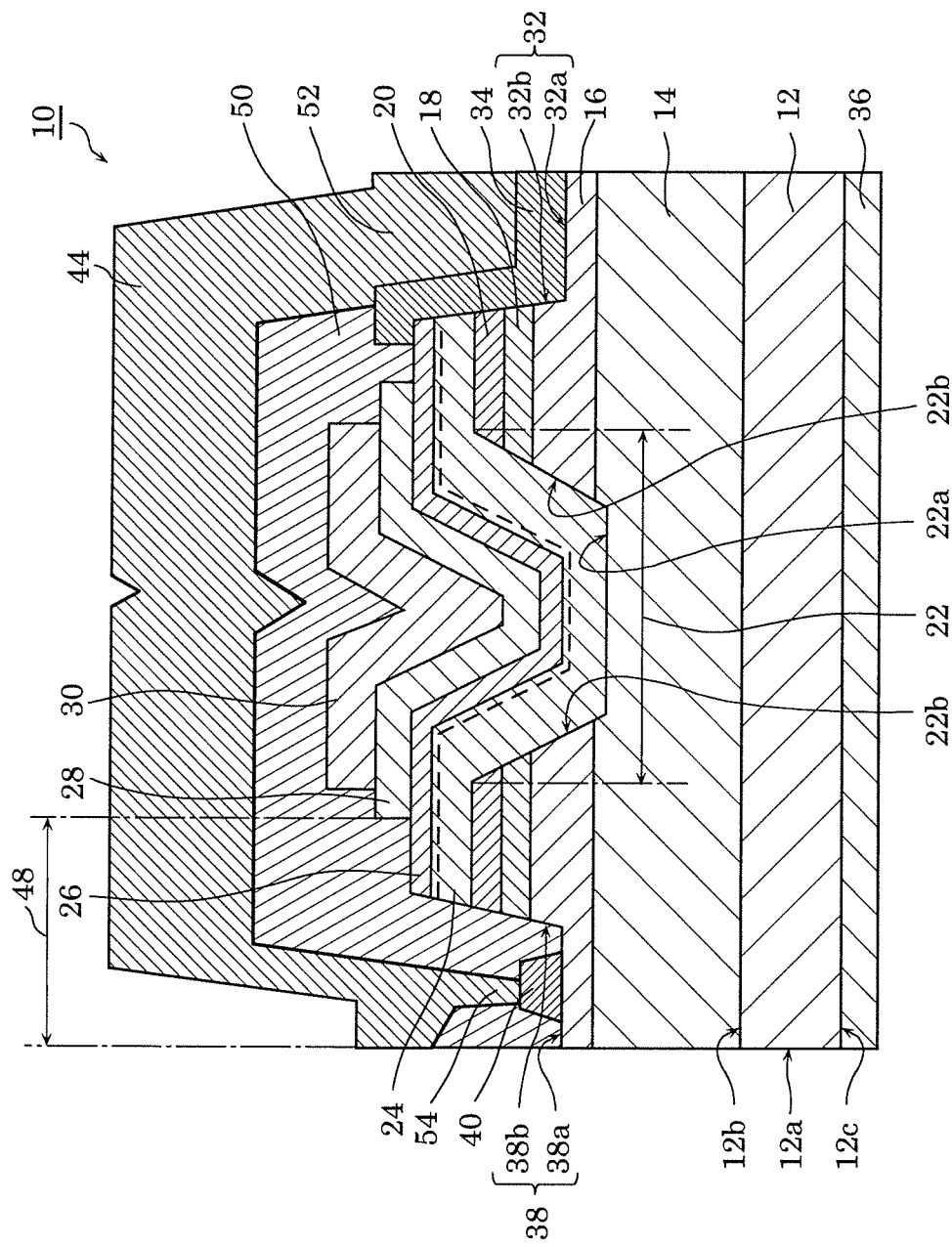
FIG. 4 is a cross-sectional view including the electrode pad of the nitride semiconductor device according to Embodiment 1.

FIG. 4 is a cross-sectional view including the electrode pad of nitride semiconductor device 10 according to the present embodiment. Specifically, FIG. 4 is a cross-section taken along line IV-IV in FIG. 3, and illustrates the same cross-section as in FIG. 2.

Gate electrode pad 42 is electrically connected to gate electrode 30. Gate electrode pad 42 is provided above gate electrode 30, for example. In the present embodiment, gate electrode 30 is formed in the shape of a single sheet, and thus gate electrode pad 42 is provided only in a region corresponding to part of nitride semiconductor device 10 as seen in plan view, as illustrated in FIG. 3. A power source for controlling gate electrode 30 is connected to gate electrode pad 42.

Source electrode pad 44 is an example of a wiring layer electrically connected to each of a plurality of source electrodes 34. Furthermore, in the present embodiment, source electrode pad 44 is electrically connected to potential fixing electrode 40. Each of the plurality of source electrodes 34 is formed having a long, rectangular island shape. Accordingly, seen in plan view, source electrode pad 44 is provided so as to cover the plurality of source electrodes 34, in a region that corresponds to most of nitride semiconductor device 10 but excludes gate electrode pad 42. For example, source electrode pad 44 is formed so as to surround gate electrode pad 42.

As illustrated in FIG. 4, source electrode pad 44 is provided above each of the plurality of source electrodes 34 and above potential fixing electrode 40. Specifically, source electrode pad 44 is provided above inter-layer insulating layer 50, which covers gate electrode 30. Source electrode pad 44 is formed thicker. For example, source electrode pad 44 is at least 5 μm thick.

Inter-layer insulating layer 50 is provided to ensure source electrode pad 44 remains insulated from gate electrode 30 and threshold control layer 28. Although not illustrated in FIG. 4, a through-hole for connecting gate electrode pad 42 and gate electrode 30 is provided in inter-layer insulating layer 50. Inter-layer insulating layer 50 is a silicon nitride film or a silicon oxide film, for example.

A plurality of contact holes 52 for connecting source electrode pad 44 to each of the plurality of source electrodes 34, and contact hole 54 for connecting source electrode pad 44 and potential fixing electrode 40, are provided in inter-layer insulating layer 50. In FIG. 3, planar shapes of the plurality of contact holes 52 and contact hole 54 are represented by solid lines.

Like source electrodes 34, the planar shapes of the plurality of contact holes 52 are rectangles. In a plan view, the plurality of contact holes 52 are located on inner sides of source electrodes 34.

Like potential fixing electrode 40, contact hole 54 is provided in an annular shape extending around the entirety of outermost edge part 48. Contact hole 54 extends continuously around potential fixing electrode 40. This makes it possible to suppress a drop in voltage within potential fixing electrode 40 and make the potential of potential fixing electrode 40 substantially uniform throughout the entire perimeter.

Note that an insulating film for surface passivation may be provided on gate electrode pad 42 and source electrode pad 44. The insulating film is formed from SiN, SiO$_2$, Al$_2$O$_3$, or the like, for example. An opening (a through-hole) used for wire bonding during mounting to a package may be provided in a part of the insulating film for surface passivation.

Leakage Current Suppression Effect

Figure 5:
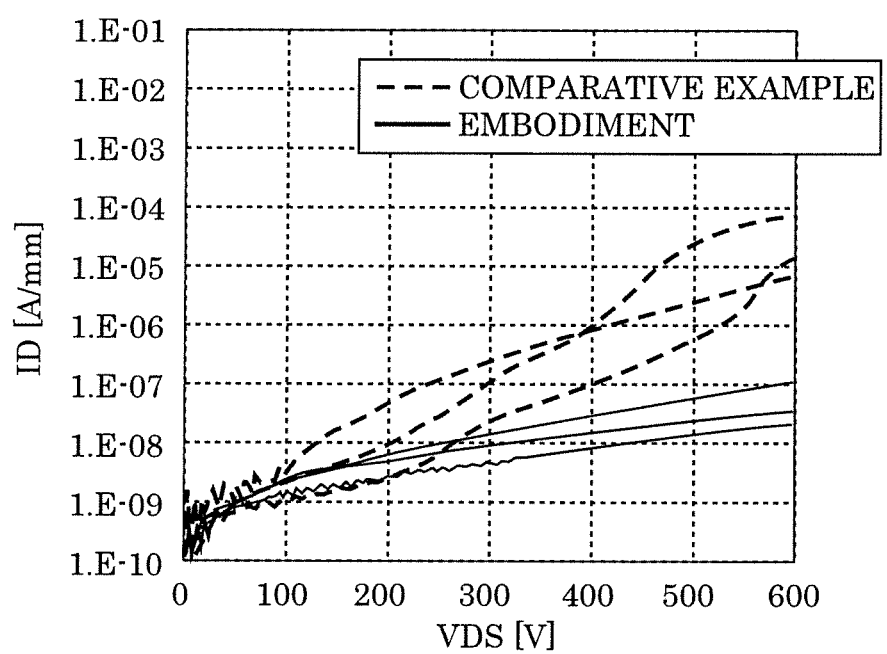
FIG. 5 is a diagram illustrating off-leak properties of the nitride semiconductor device according to Embodiment 1.

Off-leak properties of nitride semiconductor device 10 having the foregoing configuration will be described next with reference to FIG. 5. FIG. 5 is a diagram illustrating off-leak properties of nitride semiconductor device 10 according to the present embodiment. In FIG. 5, the horizontal axis represents a voltage applied across the drain and the source, and the vertical axis represents drain current flowing in drain electrode 36 when nitride semiconductor device 10 is off.

Generally, it is easy for an electrical field to concentrate at an electrode located at the outermost edge. As such, if source electrode 34, which makes contact with two-dimensional electron gas 46, is provided in outermost edge part 48 instead of potential fixing electrode 40, an electrical field will concentrate at source electrode 34 in outermost edge part 48, making it easier for leakage current to arise across the drain and the source via two-dimensional electron gas 46.

On the other hand, if neither source electrode 34 nor potential fixing electrode 40 are formed, the potential at first base layer 16 in outermost edge part 48 will be in a floating state. This reduces the effect of raising the potential provided by first base layer 16. If the potential is raised insufficiently, it will not be possible to exhaust the carrier between first base layer 16 and gate electrode 30 at outermost edge part 48. Leakage current will flow across the drain and the gate in an off state if carrier remains.

In reality, it can be seen in FIG. 5 that if potential fixing electrode 40 is not provided, the leakage current will increase as the voltage across the drain and the source increases.

As opposed to this, in the present embodiment, potential fixing electrode 40 makes contact with neither electron transport layer 24 nor electron supply layer 26, and therefore does not make contact with two-dimensional electron gas 46 either. This makes it possible to substantially eliminate leakage current between drain electrode 36 and potential fixing electrode 40 via two-dimensional electron gas 46.

Additionally, because potential fixing electrode 40 is connected to first base layer 16, the potential of first base layer 16 can be kept at a predetermined potential. Accordingly, the carrier between first base layer 16 and gate electrode 30 can be exhausted at outermost edge part 48, which makes it possible to suppress leakage current across the drain and the gate when in an off state.

In reality, as illustrated in FIG. 5, it has been confirmed that if potential fixing electrode 40 is provided, leakage current is suppressed even if the voltage across the drain and the source increases. For example, when an off voltage of 600 V is applied, off-leak current is reduced by approximately two digits as compared to a case where potential fixing electrode 40 is not provided.

With nitride semiconductor device 10 according to the present embodiment as described above, leakage current at outermost edge part 48 can be suppressed.

Variations

Next, variations on the present embodiment will be described. The following descriptions will focus on the differences from Embodiment 1, and descriptions of common points will be omitted.

Variation 1

Variation 1 will be described first. Although the embodiment described an example in which the potential of potential fixing electrode 40 is set to the same as source electrode 34, according to the present variation, the potential of potential fixing electrode 40 can be made different from source electrode 34.

Figure 6:
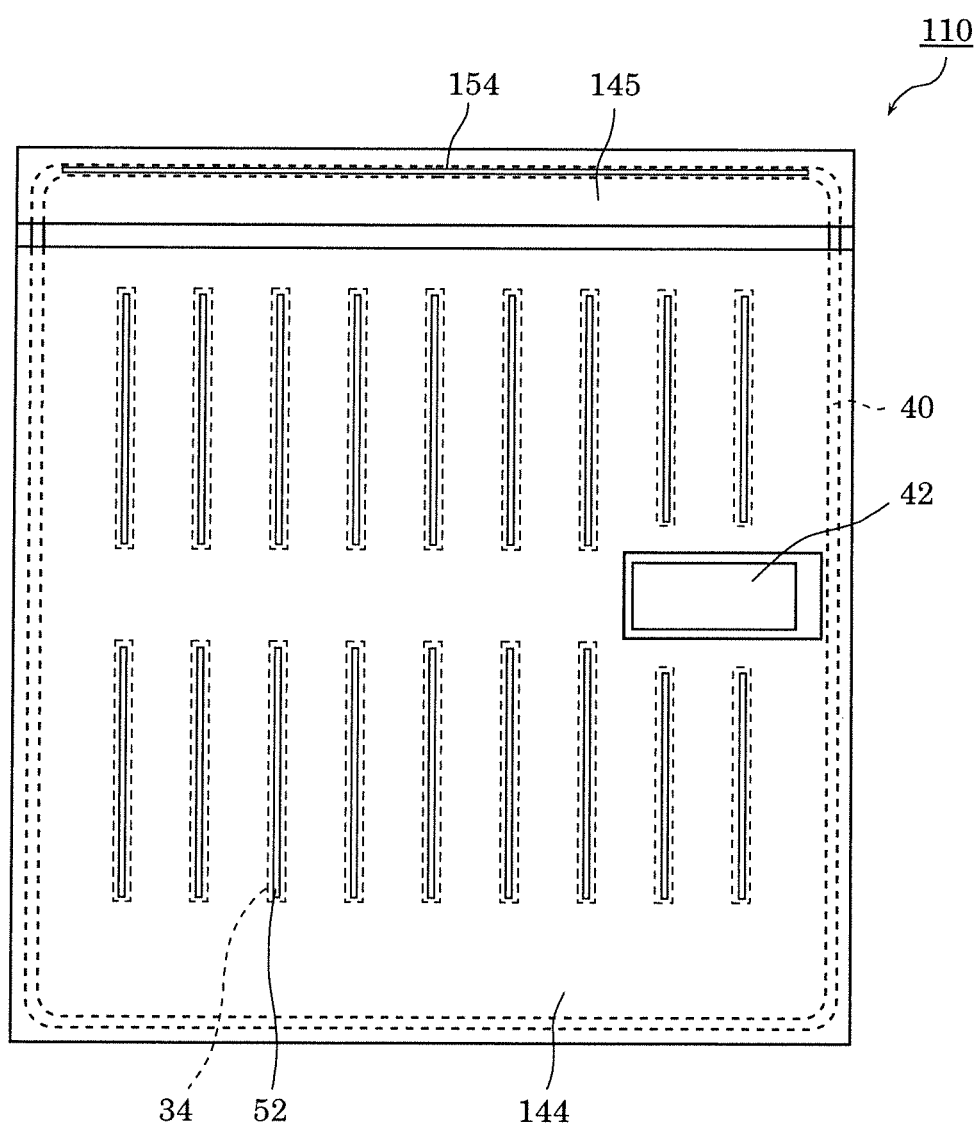
FIG. 6 is a plan view illustrating the planar shape of an electrode pad of a nitride semiconductor device according to Variation 1 on Embodiment 1.

FIG. 6 is a diagram illustrating the planar shape of an electrode pad of nitride semiconductor device 110 according to the present variation. As illustrated in FIG. 6, nitride semiconductor device 110 differs from nitride semiconductor device 10 according to Embodiment 1 in that source electrode pad 144 and potential fixing electrode pad 145 are provided instead of source electrode pad 44.

Source electrode pad 144 is connected to each of the plurality of source electrodes 34 via contact holes 52, in the same manner as source electrode pad 44. In the present variation, source electrode pad 144 is not connected to potential fixing electrode 40.

Potential fixing electrode pad 145 is connected to potential fixing electrode 40 via contact hole 154. In the present variation, potential fixing electrode pad 145 is electrically insulated from source electrode pad 144. As such, a different potential from the potential applied to source electrode pad 144 can be applied to potential fixing electrode pad 145. The potential of potential fixing electrode 40 can therefore be made different from the potential of source electrode 34.

As illustrated in FIG. 6, in a plan view, potential fixing electrode pad 145 is provided along one side of substrate 12. Specifically, potential fixing electrode pad 145 is located in a direction directly above one side of the quadrangular frame-shaped potential fixing electrode 40. Source electrode pad 44 is provided in a direction directly above the remaining three sides of the quadrangular frame-shaped potential fixing electrode 40. Note that potential fixing electrode 40 and source electrode pad 44 are insulated by inter-layer insulating layer 50 (see FIG. 3).

Nitride semiconductor device 110 according to the present variation is realized as a four-terminal device which includes a terminal for a potential fixing electrode, in addition to the three terminals of the drain, the source, and the gate. According to the present variation, the potential of potential fixing electrode 40 can be set to a different value from the potential of source electrodes 34, and thus leakage current at outermost edge part 48 can be suppressed individually, regardless of the potential applied to source electrodes 34.

Variation 2

Variation 2 will be described next. Like Variation 1, in the present variation, the potential of potential fixing electrode 40 can be made different from the potential of source electrodes 34.

Figure 7:
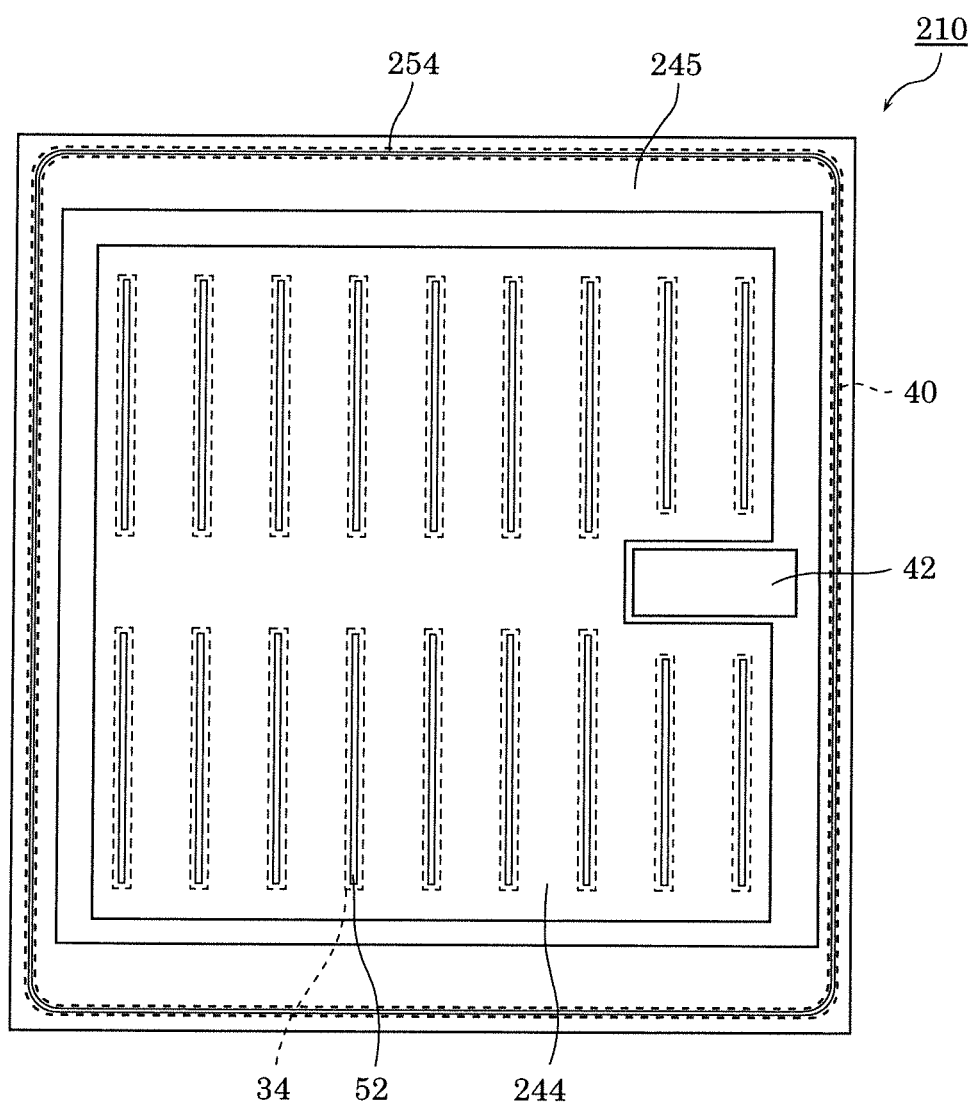
FIG. 7 is a plan view illustrating the planar shape of an electrode pad of a nitride semiconductor device according to Variation 2 on Embodiment 1.

FIG. 7 is a diagram illustrating the planar shape of an electrode pad of nitride semiconductor device 210 according to the present variation. As illustrated in FIG. 7, nitride semiconductor device 210 differs from nitride semiconductor device 110 according to Variation 1 in that source electrode pad 244 and potential fixing electrode pad 245 are provided instead of source electrode pad 144 and potential fixing electrode pad 145.

As illustrated in FIG. 7, source electrode pad 244 and potential fixing electrode pad 245 have different planar shapes from source electrode pad 144 and potential fixing electrode pad 145 according to Variation 1. Specifically, potential fixing electrode pad 245 is provided so as to surround the perimeter of source electrode pad 244.

Potential fixing electrode pad 245 is provided in an annular shape around the entirety of outermost edge part 48, in a plan view. Potential fixing electrode pad 245 extends continuously around the quadrangular frame-shaped potential fixing electrode 40. In the present variation, potential fixing electrode pad 245 surrounds gate electrode pad 42, in addition to source electrode pad 244.

Likewise, contact hole 254 provided in potential fixing electrode pad 245 is provided in an annular shape extending around the entirety of outermost edge part 48. In a plan view, contact hole 254 extends continuously around the quadrangular frame-shaped potential fixing electrode 40.

Thus with nitride semiconductor device 210 according to the present variation, a drop in voltage within potential fixing electrode 40 can be suppressed, and the potential of potential fixing electrode 40 can be made substantially uniform throughout the entire perimeter. Additionally, according to the present variation, the potential of potential fixing electrode 40 can be set to a different value from the potential of source electrodes 34, and thus leakage current at outermost edge part 48 can be suppressed individually, regardless of the potential applied to source electrodes 34.

Variation 3

Variation 3 will be described next. Although Embodiment 1 described an example in which potential fixing electrode 40 is provided continuously around the entirety of outermost edge part 48, in the present variation, potential fixing electrode 40 is divided into a plurality of parts.

Figure 8:
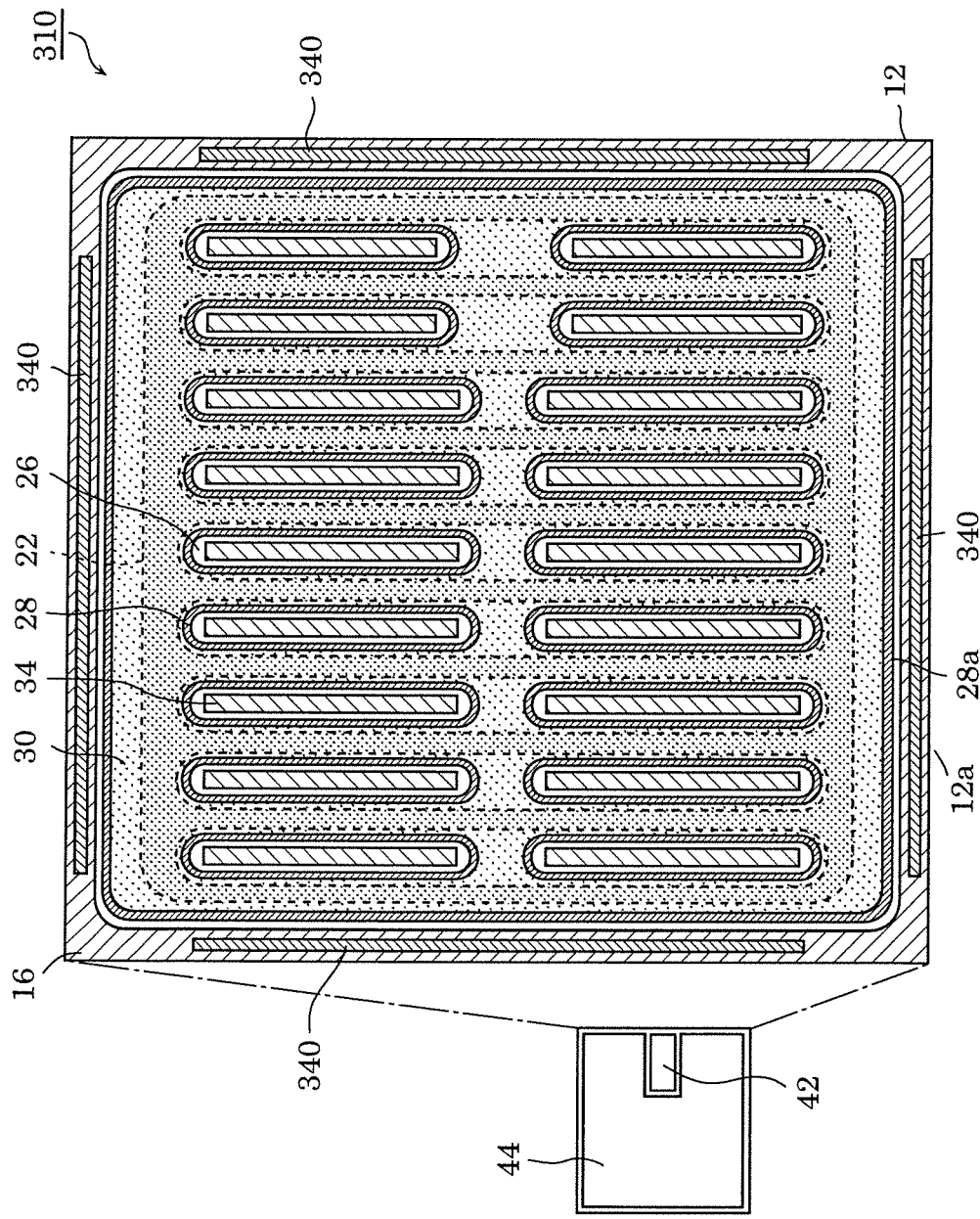
FIG. 8 is a plan view illustrating the planar layout of a nitride semiconductor device according to Variation 3 on Embodiment 1.

FIG. 8 is a plan view illustrating the planar layout of nitride semiconductor device 310 according to the present variation. As illustrated in FIG. 8, nitride semiconductor device 310 differs from nitride semiconductor device 10 according to Embodiment 1 in that potential fixing electrodes 340 are provided instead of potential fixing electrode 40.

As illustrated in FIG. 8, potential fixing electrode 340 is provided in an island shape on each side of substrate 12. In the present variation, the planar shape of substrate 12 is a quadrangle, and thus a linear potential fixing electrode 340 is provided on each side of substrate 12. Potential fixing electrodes 340 have the same function, material, and so on as potential fixing electrode 40.

Potential fixing electrodes 340 have a shape corresponding to potential fixing electrode 40 with the four corners thereof removed. Accordingly, potential fixing electrodes 340 have no curved parts resembling a right angle or an acute angle. This reduces the concentration of electrical fields at the four corners, which suppresses leakage current and increases the breakdown voltage.

Note that the potential of first base layer 16 may enter a floating state if potential fixing electrodes 340 are short and there are broad regions at the four corners of substrate 12 where potential fixing electrodes 340 are not provided. As such, each of the four potential fixing electrodes 340 may be provided so as to extend as close as possible to regions near the four corners. This makes it possible to suppress electrical field concentration arising at the four corners.

Variation 4

Variation 4 will be described next. Although Embodiment 1 described an example in which the plurality of source electrodes 34 are surrounded by gate opening 22 in a plan view, in the present variation, at least one source electrode 34 of the plurality of source electrodes 34 is not surrounded by gate opening 22. In other words, in the present variation, gate opening 22 has a different shape from that of Embodiment 1.

Figure 9:
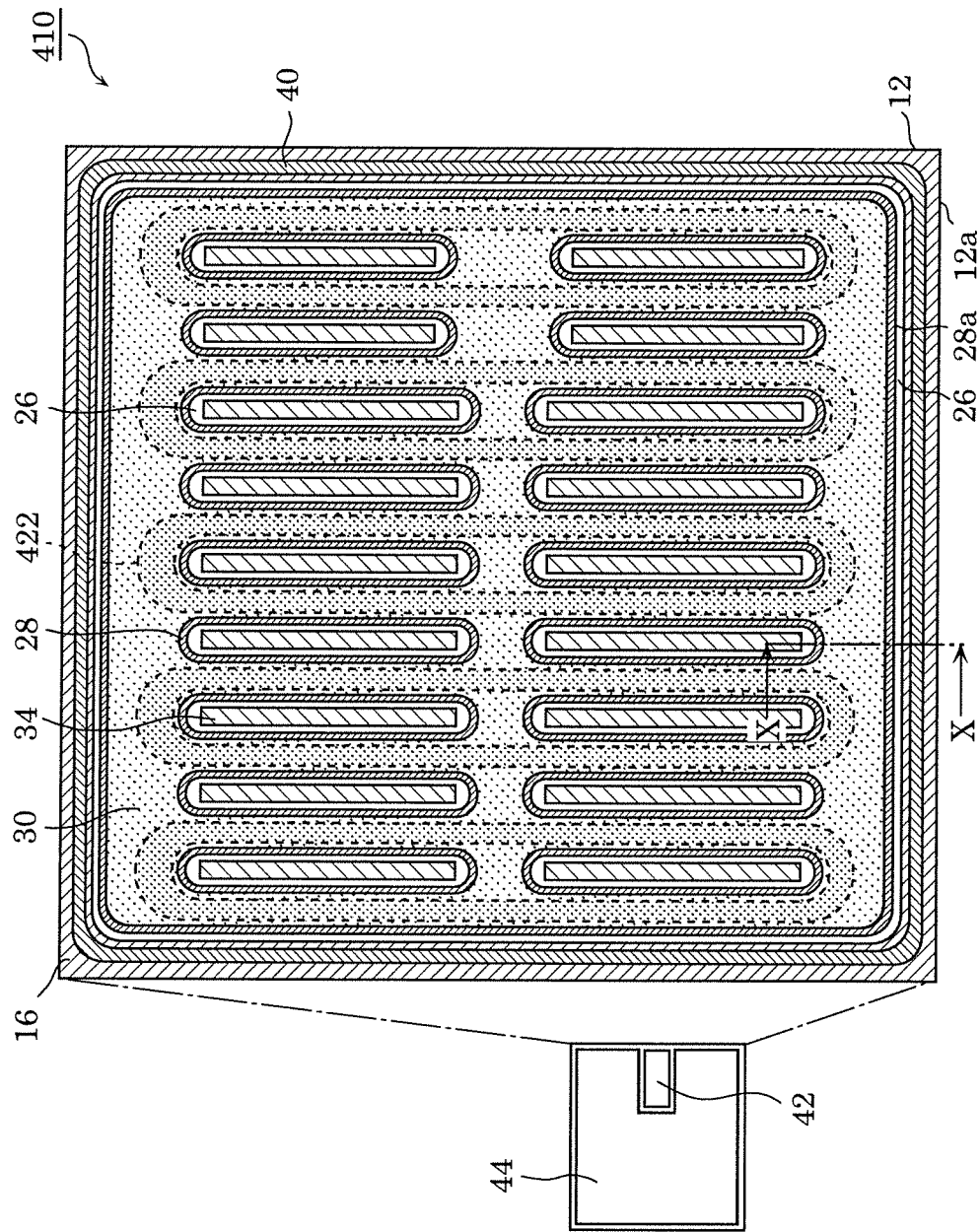
FIG. 9 is a plan view illustrating the planar layout of a nitride semiconductor device according to Variation 4 on Embodiment 1.

FIG. 9 is a plan view illustrating the planar layout of nitride semiconductor device 410 according to the present variation.

As illustrated in FIG. 9, nitride semiconductor device 410 differs from nitride semiconductor device 10 according to Embodiment 1 in that gate openings 422 are provided instead of gate opening 22.

As illustrated in FIG. 9, when two source electrodes 34 arranged in the lengthwise direction are taken as a single set, a set surrounded by gate opening 422 and a set not surrounded by gate opening 422 are arranged in the widthwise direction of source electrodes 34. Specifically, nitride semiconductor device 410 includes a plurality of gate openings 422. The planar shape of each of the plurality of gate openings 422 is an extended O-shape or a racetrack shape. Specifically, each of the plurality of gate openings 422 has linear parts which are parallel to the lengthwise direction of source electrodes 34, and curved parts provided at the ends of the linear parts. Note, however, that the plurality of gate openings 422 may include only the linear parts. According to the present variation as well, gate openings 422 are provided between every set of two adjacent source electrodes 34, and thus when on, the drain-source current is approximately the same as in Embodiment 1.

When gate openings 422 are formed through dry etching, it is easy for an electrical field to concentrate at an end part of bottom part 22a, which can cause leakage current to arise. According to the present variation, the area of gate openings 422 in a plan view is smaller than the area of gate opening 22, which reduces the number of parts where leakage current can arise and therefore makes it possible to suppress leakage current.

Figure 10:
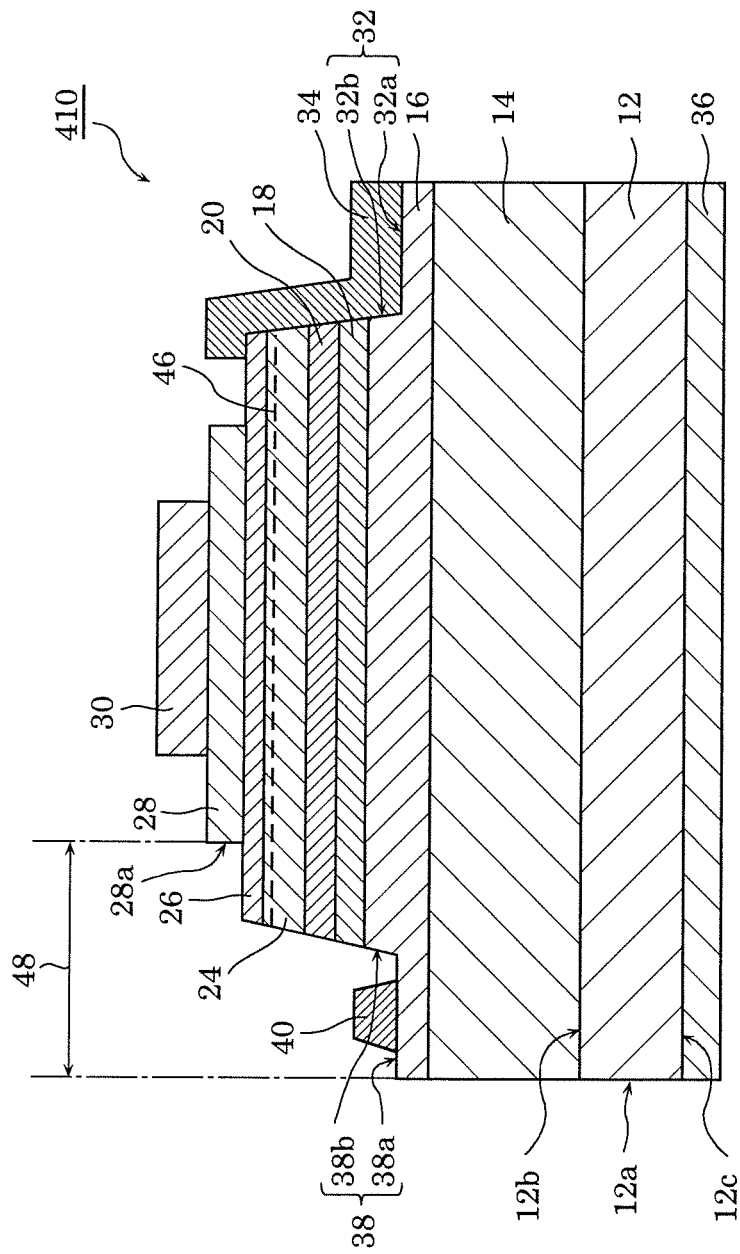
FIG. 10 is a cross-sectional view of a nitride semiconductor device according to Variation 4 on Embodiment 1.

FIG. 10 is a cross-sectional view of nitride semiconductor device 410 according to the present variation. Specifically, FIG. 10 illustrates a cross-section taken along line X-X in FIG. 9. Line X-X is a part where gate openings 422 are not provided.

As illustrated in FIG. 10, in the cross-section taken along line X-X, first base layer 16 is connected to source electrode 34 in outermost edge part 48 at a location further inward than outermost edge part 48, without being divided by gate opening 422. Thus ideally, a part of first base layer 16 located at outermost edge part 48 and a part of first base layer 16 directly below source electrode 34 will be at the same potential.

However, first base layer 16 is the sixth layer from threshold control layer 28, which is the uppermost layer, and is therefore difficult to activate through high-temperature annealing. First base layer 16 therefore has an increased resistance value. Thus in the cross-section illustrated in FIG. 10, the part of first base layer 16 located at outermost edge part 48 is distanced from source electrode 34, and that part is therefore in what is substantially a floating state. This is particularly evident in large-chip devices having large gate widths.

As opposed to this, in the present variation, potential fixing electrode 40, which is connected to first base layer 16, is provided at outermost edge part 48, as illustrated in FIGS. 9 and 10. The potential of first base layer 16 is fixed as a result, which makes it possible to suppress leakage current in the same manner as in Embodiment 1.

Embodiment 2

Embodiment 2 will be described next. The following descriptions will focus on the differences from Embodiment 1, and descriptions of common points will be omitted.

Figure 11:
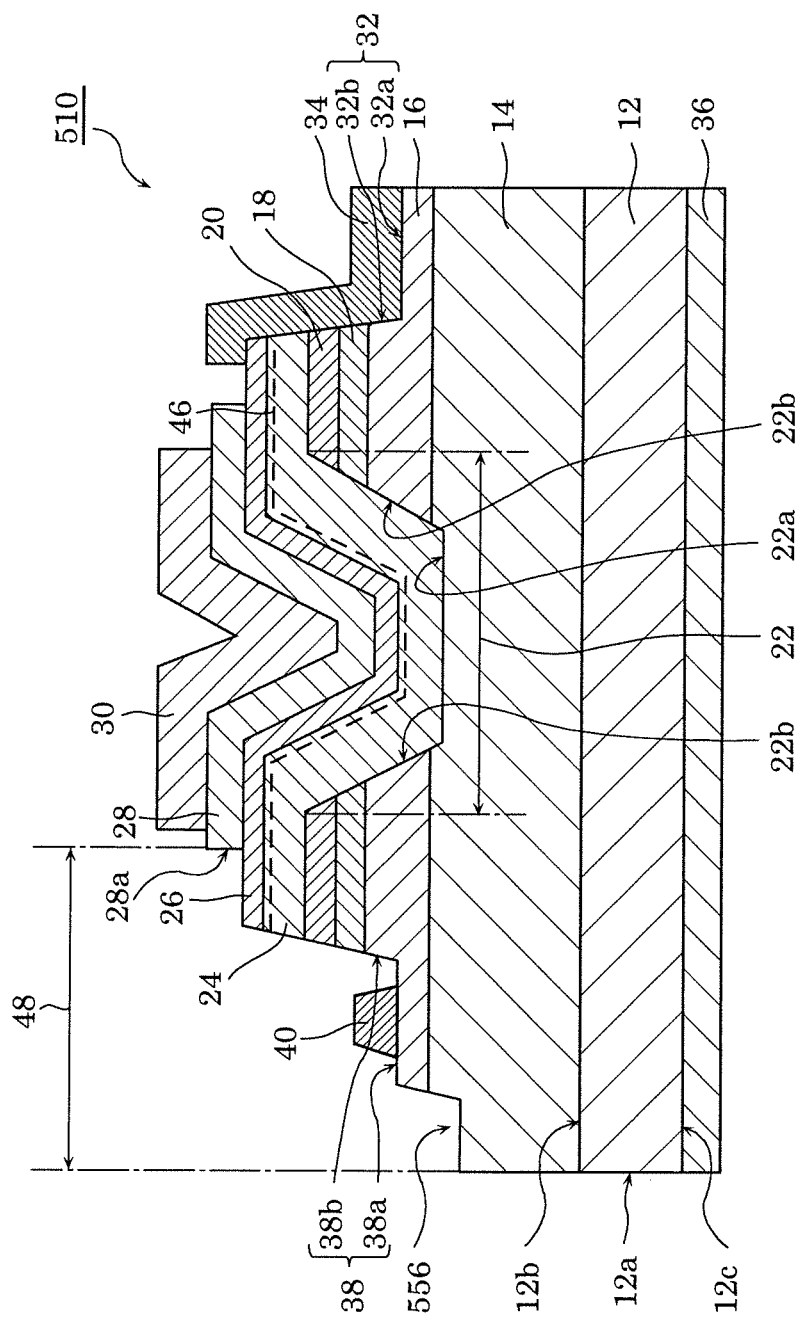
FIG. 11 is a cross-sectional view of a nitride semiconductor device according to Embodiment 2.

FIG. 11 is a cross-sectional view of nitride semiconductor device 510 according to the present embodiment. As illustrated in FIG. 11, nitride semiconductor device 510 differs from nitride semiconductor device 10 according to Embodiment 1 in that mesa separation opening 556 has been added.

As illustrated in FIG. 11, mesa separation opening 556 is an example of a fourth opening which is provided further on an outer side of potential fixing electrode 40 in outermost edge part 48 and which penetrates through first base layer 16 to drift layer 14. Mesa separation opening 556 is formed, for example, by additionally etching only the vicinity of outer edge 12a after outer perimeter opening 38 has been formed. Alternatively, mesa separation opening 556 may be formed before outer perimeter opening 38 is formed.

Mesa separation opening 556 is formed by cutting away the outer edge 12a side of bottom part 38a of outer perimeter opening 38. In other words, in a cross-sectional view, a side wall part of mesa separation opening 556 is not provided on outer edge 12a side of substrate 12, and is provided only toward the center of substrate 12.

According to the present embodiment, providing mesa separation opening 556 makes it possible to suppress leakage current flowing from an outer end surface of nitride semiconductor device 10 to gate electrode 30 through first base layer 16 and two-dimensional electron gas 46.

Figure 12:
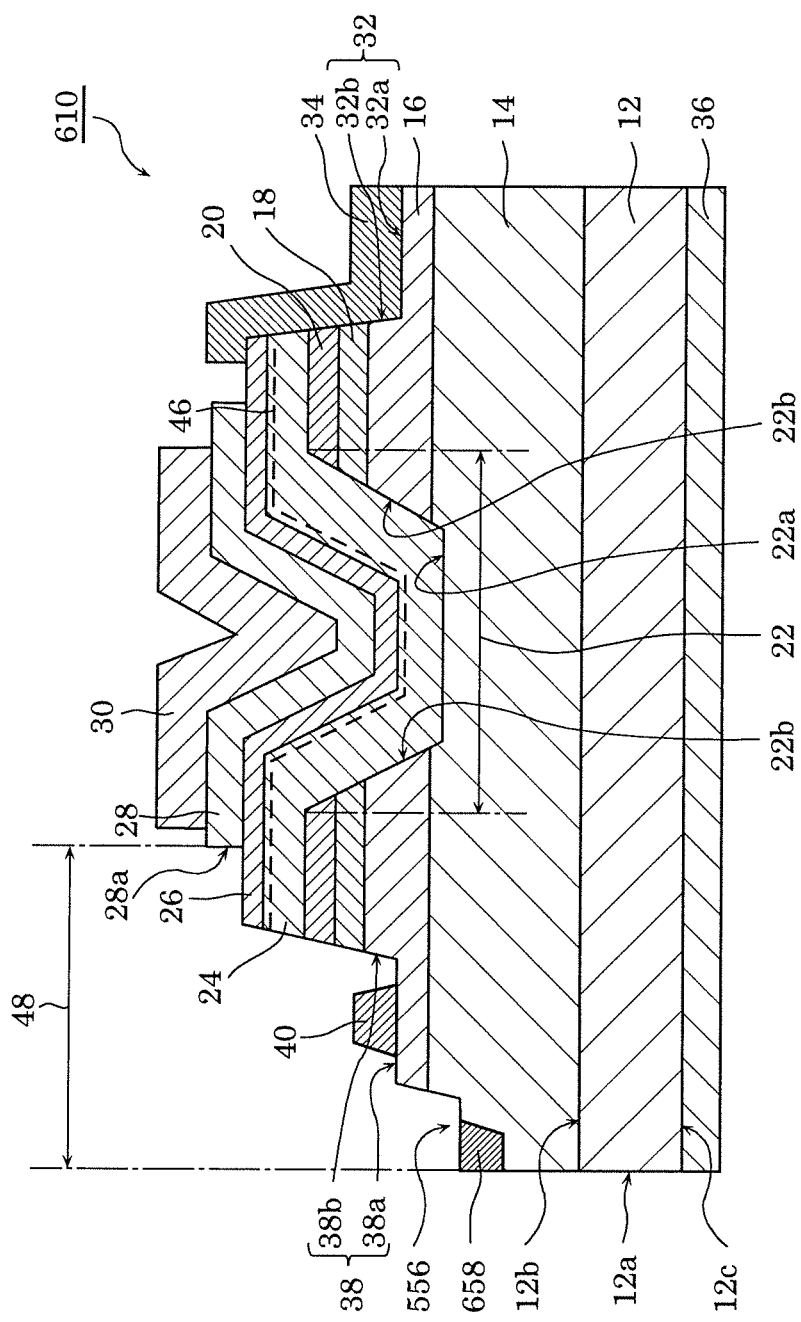
FIG. 12 is a cross-sectional view of a nitride semiconductor device according to a variation on Embodiment 2.

Furthermore, as in nitride semiconductor device 610 illustrated in FIG. 12, high-resistance region 658, which has a higher resistance than drift layer 14, may be provided in a bottom surface of mesa separation opening 556. FIG. 12 is a cross-sectional view of nitride semiconductor device 610 according to a variation on the present embodiment.

High-resistance region 658 is formed through ion implantation or the like after mesa separation opening 556 has been formed, for example. Specifically, high-resistance region 658 is formed by implanting ions of magnesium (Mg), iron (Fe), boron (B), or the like in a surface part of the $n^-$-type GaN layer constituting drift layer 14. Note that the type of implanted ions is not limited thereto.

Thus according to nitride semiconductor device 610 illustrated in FIG. 12, leakage current flowing from outer edge 12a of substrate 12 to gate electrode 30 through a surface part of drift layer 14 and two-dimensional electron gas 46 can be suppressed.

As described above, with nitride semiconductor devices 510 and 610 according to the present embodiment and the variation thereof, leakage current can be suppressed to an even greater extent.

Other Embodiments

Although one or more aspects of a nitride semiconductor device have been described thus far on the basis of embodiments, the present disclosure is not intended to be limited to these embodiments. Variations on the present embodiment conceived by one skilled in the art and embodiments implemented by combining constituent elements from different other embodiments, for as long as they do not depart from the essential spirit thereof, fall within the scope of the present disclosure.

For example, although the foregoing embodiments describe examples in which the first conductivity type is the n-type and the second conductivity type is the p-type, the conductivity types are not limited thereto. The first conductivity type may be the p-type and the second conductivity type may be the n-type.

Additionally, for example, outer perimeter opening 38 need not be provided around the entirety of substrate 12. For example, when potential fixing electrode 40 is separated into island shapes as illustrated in FIG. 8, outer perimeter opening 38 may also be provided in a divided manner, being located only in regions where potential fixing electrode 40 is provided.

Additionally, nitride semiconductor device 10 need not include threshold control layer 28.

Additionally, many changes, substitutions, additions, omissions, and the like are possible for the foregoing embodiments without departing from the scope of the claims or a scope equivalent thereto.

INDUSTRIAL APPLICABILITY

The present disclosure can be used as a nitride semiconductor device which suppresses leakage current, and can therefore be used in power transistors and the like employed in power circuitry of consumer devices such as televisions.

What is claimed is:

1. A nitride semiconductor device, comprising:
   a substrate having a first main surface and a second main surface which face in opposite directions;
   a first nitride semiconductor layer of a first conductivity type provided above the first main surface;
   a second nitride semiconductor layer of a second conductivity type provided above the first nitride semiconductor layer, the second conductivity type being different from the first conductivity type;
   a first opening which penetrates through the second nitride semiconductor layer to the first nitride semiconductor layer;
   an electron transport layer and an electron supply layer provided, in that order from a side on which the substrate is located, above the second nitride semiconductor layer and on an inner surface of the first opening;
   a gate electrode provided above the electron supply layer and covering the first opening;
   a second opening at a position distanced from the gate electrode, the second opening penetrating through the electron supply layer and the electron transport layer to the second nitride semiconductor layer;
   a source electrode provided in the second opening and connected to the second nitride semiconductor layer;
   a drain electrode provided on a second main surface-side of the substrate;
   a third opening at an outermost edge part in a plan view of the substrate, the third opening penetrating through the electron supply layer and the electron transport layer to the second nitride semiconductor layer; and
   a potential fixing electrode provided in the third opening, the potential fixing electrode being connected to the second nitride semiconductor layer and in contact with neither the electron transport layer nor the electron supply layer.

2. The nitride semiconductor device according to claim 1, wherein in a plan view of the substrate, the third opening has an annular shape extending along an entirety of the outermost edge part.

3. The nitride semiconductor device according to claim 2, wherein in a plan view of the substrate, the potential fixing electrode has an annular shape extending along an entirety of the outermost edge part.

4. The nitride semiconductor device according to claim 1, wherein a planar shape of the substrate is a quadrangle, and
   the potential fixing electrode is provided as a plurality of island shapes, each located on a corresponding one of sides of the substrate in a plan view of the substrate.

5. The nitride semiconductor device according to claim 1, wherein the potential fixing electrode is electrically connected to the source electrode via a conductive wiring layer.

6. The nitride semiconductor device according to claim 1, further comprising:
   a fourth opening provided in the outermost edge part outward of the potential fixing electrode and penetrating through the second nitride semiconductor layer to the first nitride semiconductor layer.

7. The nitride semiconductor device according to claim 6, further comprising:
   a high-resistance region provided on a bottom surface of the fourth opening and having a resistance higher than a resistance of the first nitride semiconductor layer.

8. The nitride semiconductor device according to claim 1, wherein
   a bottom part of the second opening and a bottom part of the third opening are at a same height.

* * * * *